United States Patent [19]
Nakase

[11] Patent Number: 5,508,966
[45] Date of Patent: Apr. 16, 1996

[54] SENSE AMPLIFIER CIRCUIT FOR SEMICONDUCTOR MEMORY DEVICE

[75] Inventor: Yasunobu Nakase, Hyogo, Japan

[73] Assignee: Mitsubishi Denki Kabushiki Kaisha, Tokyo, Japan

[21] Appl. No.: 387,636

[22] Filed: Feb. 13, 1995

Related U.S. Application Data

[63] Continuation of Ser. No. 37,132, Mar. 25, 1993, abandoned.

[30] Foreign Application Priority Data

Jul. 16, 1992 [JP] Japan ..................................... 4-189278

[51] Int. Cl.⁶ .................................................. G11C 7/02
[52] U.S. Cl. ................................. 365/208; 365/189.06
[58] Field of Search ........................... 365/207, 208, 365/189.06; 307/530; 327/51, 309, 319, 320

[56] References Cited

U.S. PATENT DOCUMENTS

| | | | |
|---|---|---|---|
| 4,464,591 | 8/1984 | Rapp | 307/362 |
| 4,604,533 | 8/1986 | Miyamoto | 365/208 |
| 4,713,797 | 12/1987 | Morton | 307/530 |
| 4,724,344 | 2/1988 | Watanabe | 365/208 |
| 4,799,195 | 1/1989 | Iwahashi | 365/205 |
| 4,829,479 | 5/1989 | Mitsumoto | 365/189.09 |
| 4,879,681 | 11/1989 | Miwa | 327/51 |
| 5,063,540 | 11/1991 | Takahashi | 365/189.09 |
| 5,065,055 | 11/1991 | Reed | 307/296.1 |
| 5,184,036 | 2/1993 | Kesler | 307/564 |
| 5,241,504 | 8/1993 | Seevinck | 365/208 |
| 5,247,479 | 9/1993 | Young | 365/208 |
| 5,296,755 | 3/1994 | Miyamoto | 307/570 |
| 5,331,233 | 7/1994 | Urakawa | 307/530 |

OTHER PUBLICATIONS

Textbook—Microelectronic Circuits, 2nd Edition Adel S. Sedra & Kenneth C. Smith HRW, Inc., New York, 1987, PG A–9.

"A 9ns 4Mb BICMOS SRAM with 3.3V Operation", by Hatsuhiro Kato et al, ISSCC Digest of Technical Papers, Feb. 1992, pp. 210–211.

*Primary Examiner*—William L. Sikes
*Assistant Examiner*—Tiep H. Nguyen
*Attorney, Agent, or Firm*—Lowe, Price, LeBlanc & Becker

[57] ABSTRACT

In order to increase the speed, reduce the number of components and lower power consumption in a sense amplifier circuit for reading data held in a selected memory cell, current difference appearing on a data line is converted to potential difference directly by a current mirror circuit in accordance with data held in a selected memory cell. This current mirror circuit includes a diode for clamping the potential of the data line, and a transistor which is connected with this diode in a current mirror arrangement. A sense current flows through the diode in accordance with the data held in the selected memory cell, a corresponding current flows through the transistor by a current mirror operation, and the sense current is monitored. The monitored sense current is converted to a voltage signal indicating data of the selected memory cell.

20 Claims, 13 Drawing Sheets

FIG. 2A
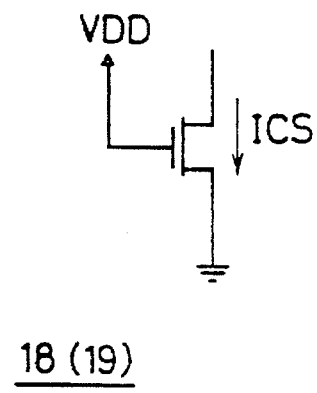
18 (19)
FIG. 2B
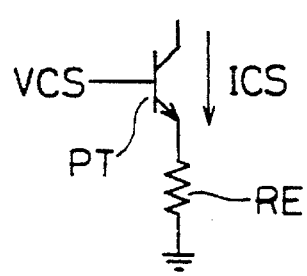
18 (19)
FIG. 3
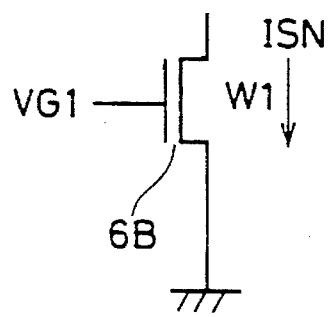
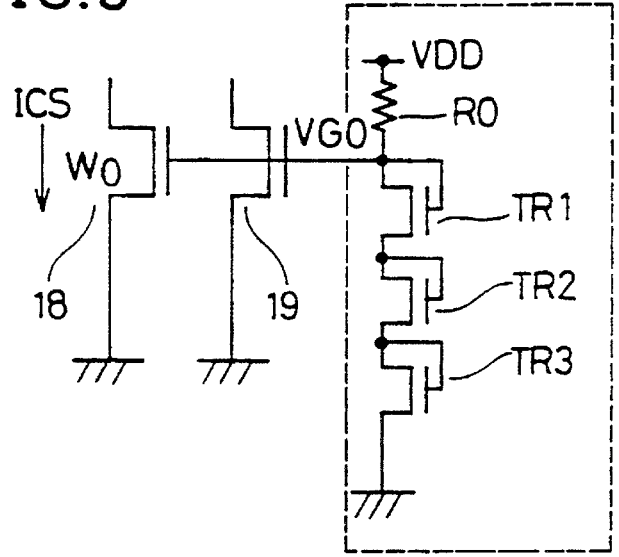
VG1 > VG0
OR
W1 > W0

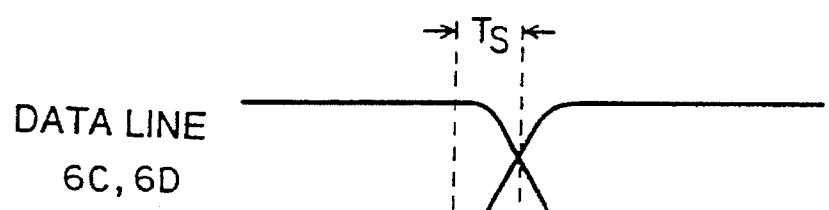
FIG. 11A  DATA LINE 6C, 6D
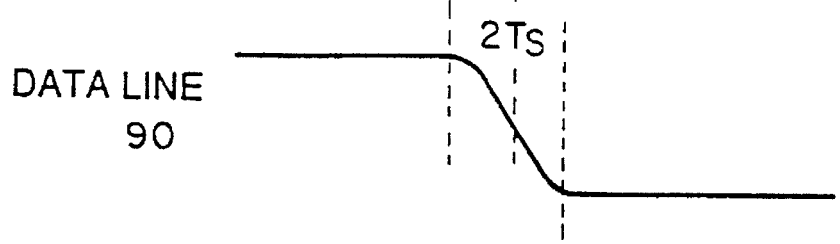
FIG. 11B  DATA LINE 90

SENSE AMPLIFIER CIRCUIT FOR SEMICONDUCTOR MEMORY DEVICE

This application is a continuation of application Ser. No. 08/037,132 filed Mar. 25, 1993 now abandoned.

BACKGROUND OF THE INVENTION

1. Field of the Invention

The present invention relates to a sense amplifier circuit for detecting and amplifying data of a selected memory cell in a semiconductor memory device, and more particularly, it relates to an improvement to a sense amplifier circuit which generates a sense current on an internal data line in accordance with data of a selected memory cell.

2. Description of the Background Art

In recent years, semiconductor memory devices are increasingly improved in operating speed. For example, a static random access memory (SRAM) has an access time of not more than 10 ns (nanoseconds). In relation to such SRAM, various improvements are proposed in order to attain large storage capacity, high-speed operability and low power consumption.

FIG. 14 shows an overall structure of a conventional SRAM. Referring to FIG. 14, the SRAM includes a memory cell array 700 having static memory cells which are arranged in a matrix of rows and columns, an X address buffer 702 which receives an X address for generating an internal X address, an X decoder 704 which decodes the internal X address received from the X address buffer 702 for selecting a row (word line) in the memory cell array 700, a Y address buffer 706 which receives a Y address for generating an internal Y address, a Y decoder 708 which decodes the internal Y address and generates a column selection signal for selecting a prescribed number of columns (bit line pairs) in the memory cell array 700, and a Y select gate 710 which connects a corresponding column to an internal data line in response to the column selection signal.

The number of the columns specified by the Y decoder 708 is varied with the bit organization of the SRAM. A single column is selected when data are inputted/outputted in a unit of one bit, while a plurality of columns are selected when data are inputted/outputted in a unit of a plurality of bits. When the memory cell array 700 is divided into blocks, the Y decoder 708 also generates a signal for specifying a block.

The SRAM further includes a first sense amplifier circuit 712 which detects and amplifies data on the column(s) selected by the Y select gate 710, and a second sense amplifier circuit 714 which further amplifies the data amplified by the first sense amplifier circuit 712. The first and second amplifiers 712 and 714 are so provided as to reduce a signal swing in the internal data line, thereby increasing the speed of the sensing operation.

The SRAM further includes an output buffer 716 which generates external read data from the data amplified by the second sense amplifier circuit 714, an input buffer 718 which receives externally supplied write data and generates internal write data in data writing, and a write driver 720 which transmits the internal write data received from the input buffer 718 onto the column(s) selected by the Y select gate 710. Referring to FIG. 14, symbol DQ denotes the external write data and the external read data, which are inputted/outputted through a common pin terminal. This pin terminal may be replaced by separate pin terminals.

As is well known in the art, a memory cell which is located on an intersection of a row (word line) and a column (bit line pair) specified by X and Y addresses is selected in data writing or reading of an SRAM. Data is written in or read from the selected memory cell.

FIG. 15 shows the structure of a principal part of a conventional semiconductor memory device. The semiconductor memory device shown in FIG. 15 is an SRAM, which is disclosed in ISSCC Digest of Technical Papers, February 1992, pp. 210 to 211 by Kato et al., for example. This figure illustrates a principal part of the circuit structure of the SRAM which is shown in the above literature in a simplified manner. The SRAM shown in FIG. 15 comprises NPN bipolar transistors and complementary field effect transistors (CMOS transistors) as components. Referring to FIG. 15, parts corresponding to the elements shown in FIG. 14 are denoted by the like reference numerals employed in relation to FIG. 14, for the purpose of reference.

Memory cell array 700 includes static type memory cells 61, which are arranged in rows and columns. FIG. 15 typically shows only one of such memory cells 61. Each static type memory cell 61 includes N-channel MOS transistors 613 and 614 having gates and drains cross-connected and high-resistance elements 611 and 612 for pulling up the drains (nodes NL and NR) of the transistors 613 and 614 to a first source potential VDD. The high-resistance element 611 and the N-channel MOS transistor (driver transistor) 613 form an inverter circuit, while the high-resistance element 612 and the N-channel MOS transistor (driver transistor) 614 form another inverter circuit. These inverter circuits are cross-connected with each other.

The static type memory cell 61 further includes access transistors 615 and 616, which are formed by N-channel transistors respectively. The access transistors 615 and 616 connect the nodes NL and NR to bit lines 63 and 64 in response to a signal potential on a word line 62, respectively. The bit lines 63 and 64, which are paired with each other, receive complementary signals. These bit lines 63 and 64 are provided with load elements 65 and 66 for supplying currents to the bit lines 63 and 64. The load element 65 is formed by a P-channel MOS transistor which is resistively connected between the source potential VDD and the bit line 63. The other load element 66 includes a P-channel MOS transistor serving as a resistance which is connected between the source potential VDD and the bit line 64. These load elements 65 and 66 may be formed by high-resistance elements of polysilicon or the like.

First sense amplifier circuit 712 includes a sense amplifier 60 which is provided for the bit lines 63 and 64. Such sense amplifier 60 is provided for each respective bit line pair. FIG. 15 shows a first sense amplifier 6G which is provided for another bit line pair BL and /BL.

The first sense amplifier 60 includes NPN bipolar transistors 69 and 6A having emitters connected in common, and an N-channel MOS transistor 6B which couples the emitters of the bipolar transistors 69 and 6A to a second source potential (ground potential) in response to a bit line selection signal YS. The transistors 69, 6A and 6B form a differential amplifier of an emitter coupled logic type.

The first sense amplifier 60 further includes first and second level shifters for preventing the transistors 69 and 6A from being saturated. The first level shifter includes an NPN bipolar transistor 67A having a base which is coupled to the bit line 63, an emitter which is connected to a base of the transistor 69 and a collector which is connected to the source potential VDD, and an N-channel MOS transistor 68A which couples the base of the transistor 69 to the ground potential in response to the bit line selection signal YS. The other level shifter includes an NPN bipolar transistor 67B having a base which is connected to the bit line 64, a collector which is connected to the source potential VDD and an emitter which is connected to a base of the bipolar transistor 6A, and an N-channel MOS transistor 68A which couples the base of the bipolar transistor 6A to the ground potential in response to the bit line selection signal YS. The transistors 67A and 67B operate in an emitter follower mode, to shift in level the potentials of the bit lines 63 and 64 and transmit the same to the bases of the transistors 69 and 6A. The transistors 68A and 68B form a Y select gate, while the transistor 6B forms a Y select gate and a sense amplifier driving circuit.

When a bipolar transistor is saturated, both of base-collector and base-emitter junctions are forward-biased in general. Since a forward-biased junction diode has high diffusion capacitance, a collector current is not reduced until the collector-base junction is biased in the reverse direction. When the bipolar transistor is driven in a saturation region, its switching speed is slowed. A level shifter is provided in order to drive the bipolar transistor in a non-saturated state for attaining a high speed operation. An output of the first sense amplifier 60 is transmitted to data lines 6C and 6D.

The second sense amplifier circuit 714 includes a second sense amplifier 6E which generates a voltage signal in accordance with currents on the data lines 6C and 6D. The second sense amplifier 6E includes clamp diodes 6E1 and 6E2 for clamping the data lines 6C and 6D at prescribed potentials, current sources 6E9 and 6EA for supplying constant steady-state currents to the clamp diodes 6E1 and 6E2 respectively, NPN bipolar transistors 6E5 and 6E6 forming an emitter coupled logic for differentially amplifying potentials on the data lines 6C and 6D, a current source 6EB for sinking currents from the transistors 6E5 and 6E6, resistance elements 6E3 and 6E4 for generating voltage signals in accordance with collector currents of the transistors 6E5 and 6E6, and NPN bipolar transistors 6E7 and 6E8 for driving output signal lines 6EF and 6EG in accordance with the voltage signals generated by the resistance elements 6E4 and 6E3 respectively. Emitters of the transistors 6E7 and 6E8 are connected with current sources 6EC and 6ED respectively. The current sources 6E9 and 6EA supply the same constant currents.

An output of the second sense amplifier 6E is transmitted to an output circuit 6F, which may be included in the output buffer 716, or may be a preamplifier provided in a front stage of the output buffer 716. The operation of the sense amplifier circuit, i.e., an operation for reading data from the memory cell 61 is now described.

In order to select the memory cell 61, the word line 62 which is connected with the memory cell 61 and the bit line selection signal YS for selecting the bit line pair which is connected with the memory cell 61 are brought into to high potential levels. For convenience of illustration, it is assumed here that the memory cell 61 is maintained in such a state that the node NL is at a high potential (equal to the source potential VDD) and the other node NR is at a low potential (equal to the ground potential). It is also assumed that the bit lines 63 and 64 are precharged at the high potential in advance of data reading.

When the potential of the word line 62 goes high, the access transistors 615 and 616 enter ON states. The potential of the node NR is at a low level and a current flows into the node NR from the bit line 64 through the transistor 616. This current is supplied from the source potential VDD through the load element 66 which is provided on the bit line 64. The current flows through the bit line 64 and the potential of this bit line 64 is reduced by resistance of the load element 66.

The node NL is connected to the bit line 63 through the transistor 615. The potential of the node NL is at a high level. Since the bit line 63 and the node NL are at the same potential, no current flows to the node NL through the transistor 615. Namely, no current flows to the load element 65 provided on this bit line 63, and hence the potential of the bit line 63 remains at the precharged high level. The potentials of the bit lines 63 and 64 are supplied to the bases of the transistors 67A and 67B, level-shifted by base-to-emitter forward voltages (VBE) of the transistors 67A and 67B and supplied to the bases of the bipolar transistors 69 and 6A (when the transistors 68A and 68B enter ON states).

When the potential of the bit line selection signal YS goes high, the transistors 68A, 68B and 6B enter conducting states. The bipolar transistors 67A and 67B, which operate in an emitter follower mode, have functions of clamping the emitter potentials. Since the potential of the bit line 63 is at a high level and that of the bit line 64 is at a low level, the bipolar transistor 69 enters an ON state and the bipolar transistor 6A enters an OFF state. The value of a current flowing in the bipolar transistor 69 is decided by current drivability of the transistor 6B.

in the second sense amplifier 6E, the current sources 6E9 and 6EA are set to supply equal amounts of currents. When no currents flow in the data lines 6C and 6D, the bipolar transistors 6E5 and 6E6 have equal base potentials. In data reading, a current flows in one of the data lines 6C and 6D. In this case, the bipolar transistor 69 is in an ON state and a current flows from the data line 6C through the bipolar transistor 69 and the MOS transistor 6B. The data line 6C is supplied with a current from the source potential VDD through the diode 6E1. Therefore, the value of the current flowing through the diode 6E1 exceeds that of the current flowing through the diode 6E2. Thus, the base potential of the bipolar transistor 6E5 becomes slightly lower than that of the bipolar transistor 6E6, whereby the bipolar transistor 6E5 enters a nonconducting state and the bipolar transistor 6E6 enters a conducting state.

Such conduction of the bipolar transistor 6E6 feeds a current to the resistance element 6E4 and reduces the base potential of the bipolar transistor 6E7. The base potential of the bipolar transistor 6E8 is at a high level since no current flows through the resistance element 6E3. The bipolar transistor 6E7 and 6E8 operate in an emitter follower mode in accordance with the base potential, and drive the output signal lines 6EF and 6EG. The potential of the output node 6EF becomes lower than that of the output node 6EG. The signal potentials of the output nodes 6EF and 6EG are further amplified by the output circuit 6F, whereby read data are generated.

In the conventional sense amplifier circuit shown in FIG. 15, as hereinabove described, the potential difference between the bit lines 63 and 64 is converted to current difference by the first sense amplifier 60, and this current difference is again converted to the potential difference by the second sense amplifier 6E.

The data lines 6C and 6D are generally connected with a number of first sense amplifiers 60 corresponding to the bit line pairs. Since a number of memory cells are connected to a single row, interconnection lengths of the data lines 6C and 6D are increased. Thus, the data lines 6C and 6D have large parasitic capacitances. Since potential changes on the data lines 6C and 6D in data reading accompany charge/discharge of the large parasitic capacitances, time delay is so increased that the sensing operation cannot be performed at a high speed. In order to minimize the potential changes on the data lines 6C and 6D, the diodes 6E1 and 6E2 clamp the potentials of the data lines 6C and 6D for transmitting the signals to the second sense amplifier 6E in current modes.

The conventional sense amplifier circuit shown in FIG. 15 has the following problems:

(1) As hereinabove described, it is necessary to minimize the potential changes in the data lines 6C and 6D since the signal transmission time to the second sense amplifier 6E is increased with the potential changes. In order to reduce the potential changes, the diodes 6E1 and 6E2 clamp the potentials of the data lines 6C and 6D. When a current IF flows through a diode, potential difference VF developed between an anode and a cathode of this diode is generally expressed as follows:

$$VF=VT \cdot \ln (IF/A)$$

where VT represents a coefficient changing in accordance with a temperature which is generally expressed as k·T/q. This coefficient is about 26 mV at the room temperature. Further, k represents the Boltzmann's constant, q represents the amount of charges of an electron, T represents an absolute temperature, and A represents a constant.

It is assumed here that the currents supplied by the current sources 6E9 and 6EA are set at 0.1 mA and the current supplied by the transistor 6B, i.e., a sense current, is set at 0.5 mA. Assuming that a current of 0.1 mA flows through a diode and this diode has potential difference VF of 0.8 mV, potential difference of about 0.85 V is developed in the diode upon flowing of a sense current since a current of 0.6 mA flows through the diode. Thus, a potential swing at the data line 6C (or 6D) can be suppressed to 0.85–0.8 (V), i.e., 50 mV.

This potential difference is amplified by the bipolar transistors 6E5 and 6E6 provided in the second sense amplifier 6E. As the potential difference between the data lines 6C and 6D is reduced, it is difficult to completely switch conduction/nonconduction of the emitter-coupled bipolar transistors 6E5 and 6E6. Thus, the output swing of the second sense amplifier 6E (potential difference between the output nodes 6EF and 6EG) is reduced and the time required for amplifying the potentials in the second sense amplifier 6E is increased, since both of the bipolar transistors 6E5 and 6E6 feed currents. Namely, conditions required for attaining high speed operation of the first and second sense amplifiers 60 and 6E collide with each other.

(2) The output potential swing of the second sense amplifier 6E cannot exceeds 0.8 V, in order to prevent the bipolar transistors 6E5 and 6E6 from being saturated. More specifically, the swing of the output potential of the second sense amplifier 6E is equal to those of the collector potentials of the bipolar transistors 6E5 and 6E6. Assuming that a potential drop at the diode 6E2 is 0.8 V, the base potential of the bipolar transistor 6E6 is VDD–0.8 V. If the second sense amplifier 6E has an output potential swing of 1.0 V, for example, the collector potential of the bipolar transistor 6E6 is VDD–1.0 V, and this bipolar transistor 6E6 operates in a saturated state since its base-collector junction is biased in the forward direction. In order to prevent this state, the output potential swing of the second sense amplifier 6E cannot exceed 0.8 V.

This potential swing of 0.8 V may cause no serious problem if an interface is an ECL (emitter coupled logic), since a high potential level is –0.9 V and a low potential level is –1.7 V in such an emitter coupled logic with a potential swing of 0.8 V. When the interface is a TTL (transistor-transistor logic) having a high potential VIH of an input signal of 2.0 V and a low potential VIL of 0.8 V or a CMOS having a high potential of a source potential level and a low potential of the ground potential level, however, the potential swing is 1.2 V or 5 V (when an operating source potential is 5 V), and no interface can be attained in this case. In order to interface with TTL or CMOS circuitry, the output circuit 6F must be provided with a level converter for further voltage amplification, and hence the delay time is increased in the output circuit 6F.

(3) The second sense amplifier 6E requires five current sources 6E9, 6EA, 6EB, 6EC and 6ED. When this semiconductor memory device inputs and outputs data in a unit of a plurality of bits, it is necessary to provide the second sense amplifiers 6E in a number equal to that of the bits forming the input/output unit, and hence the current consumption is remarkably increased. When the memory device is applied to a by 32-bit organization memory containing type processor, 32 second sense amplifiers 6E are required to require 160 (5×32) current sources, resulting in a large current consumption.

SUMMARY OF THE INVENTION

An object of the present invention is to provide a sense amplifier circuit, which can operate at a high speed and sufficiently increase an output potential swing.

Another object of the present invention is to provide a sense amplifier circuit which requires a low current consumption.

Briefly stated, the sense amplifier circuit according to the present invention has a structure of not amplifying a slight potential difference associated with current difference appearing on data lines, but directly converting such current difference itself appearing on the data lines to potential difference.

The sense amplifier circuit according to the present invention preferably comprises a current mirror type sense amplifier, having a clamp element for clamping the potential of a data line as a component, which converts a current signal appearing on the data line to a potential signal by a current mirror operation.

Since the current difference appearing on the data lines is directly converted to potential difference, it is possible to generate a signal having a large output potential swing at a high speed, with no requirement for amplification of small potential difference.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B illustrate the structures of current sources employed in the sense amplifier circuit according to the present invention;

FIG. 3 illustrates the structures of a sense current source employed for first and second sense amplifiers shown in FIG. 1 and a steady-state current source for a clamp diode;

FIG. 11 illustrates potential changes caused in data lines shown in FIG. 10 upon generation of a sense current;

DESCRIPTION OF THE PREFERRED EMBODIMENTS

[Embodiment 1]

Figure 1:
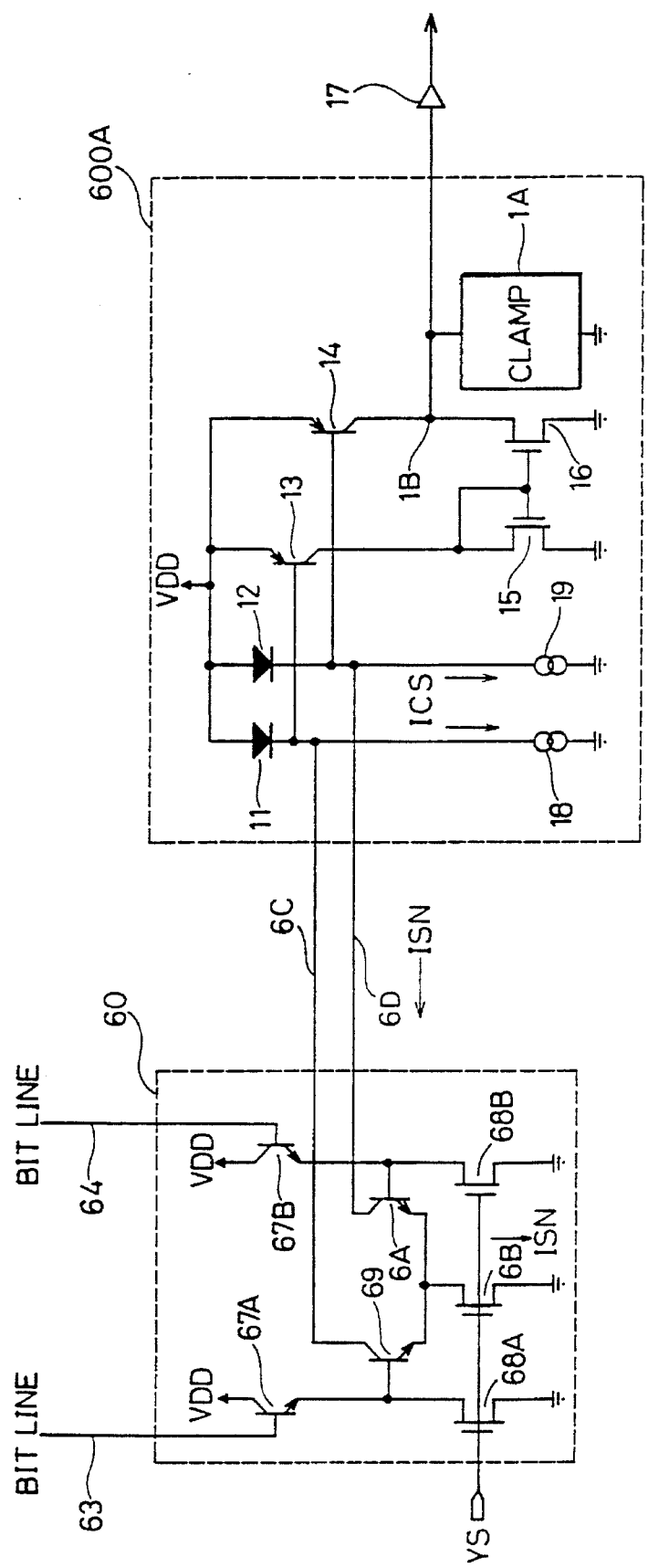
FIG. 1 illustrates the structure of a sense amplifier circuit according to a first embodiment of the present invention.

FIG. 1 illustrates the structure of a sense amplifier circuit according to a first embodiment of the present invention. FIG. 1 shows only a portion corresponding to the second sense amplifier shown in FIG. 15. A first sense amplifier 60 in this embodiment is similar to that shown in FIG. 15, and a circuit structure of developing current difference between data lines 6C and 6D in accordance with data held in a selected memory cell is identical to that shown in FIG. 15. As to the structures and operations of the first sense amplifier 60, memory cells and the like, therefore, corresponding portions are denoted by the same reference numerals, to omit detailed description thereof.

Referring to FIG. 1, a second sense amplifier 600A includes clamp diodes 11 and 12 for clamping the data lines 6C and 6D at prescribed potentials, and current sources 18 and 19 for stationarily supplying currents to the diodes 11 and 12. These current sources 18 and 19 supply the same amount of currents. The currents supplied by the current sources 18 and 19 are set at values sufficiently smaller than a current supplied by a transistor 6B which is included in the first sense amplifier 60, i.e., a sense current.

The second sense amplifier 600A further includes a PNP bipolar transistor 13 forming a current mirror circuit together with the clamp diode 11, another PNP bipolar transistor 14 forming another current mirror circuit together with the clamp diode 12, and N-channel MOS transistors 15 and 16 for converting a current supplied by the PNP bipolar transistor 13 to a voltage signal by a current mirror operation. The transistor 15 has a gate and a drain which are connected to a collector of the bipolar transistor 13, while the transistor 16 has a gate which is connected to the collector of the bipolar transistor 13 and a drain which is connected to a collector of the PNP bipolar transistor 14 through an output node 1B.

The second sense amplifier 600A further includes a clamp circuit 1A for clamping a high potential level of the output node 1B at a prescribed potential in order to prevent the bipolar transistor 14 from being saturated. A signal potential of the output node 1B of the second sense amplifier 600A is supplied to a buffer circuit 17. This buffer circuit 17 may be formed by an output buffer, or a circuit provided in a preceding stage of such an output buffer.

Bases of the bipolar transistors 13 and 14 are connected to the data lines 6C and 6D respectively. The operation is now described.

Figure 15:
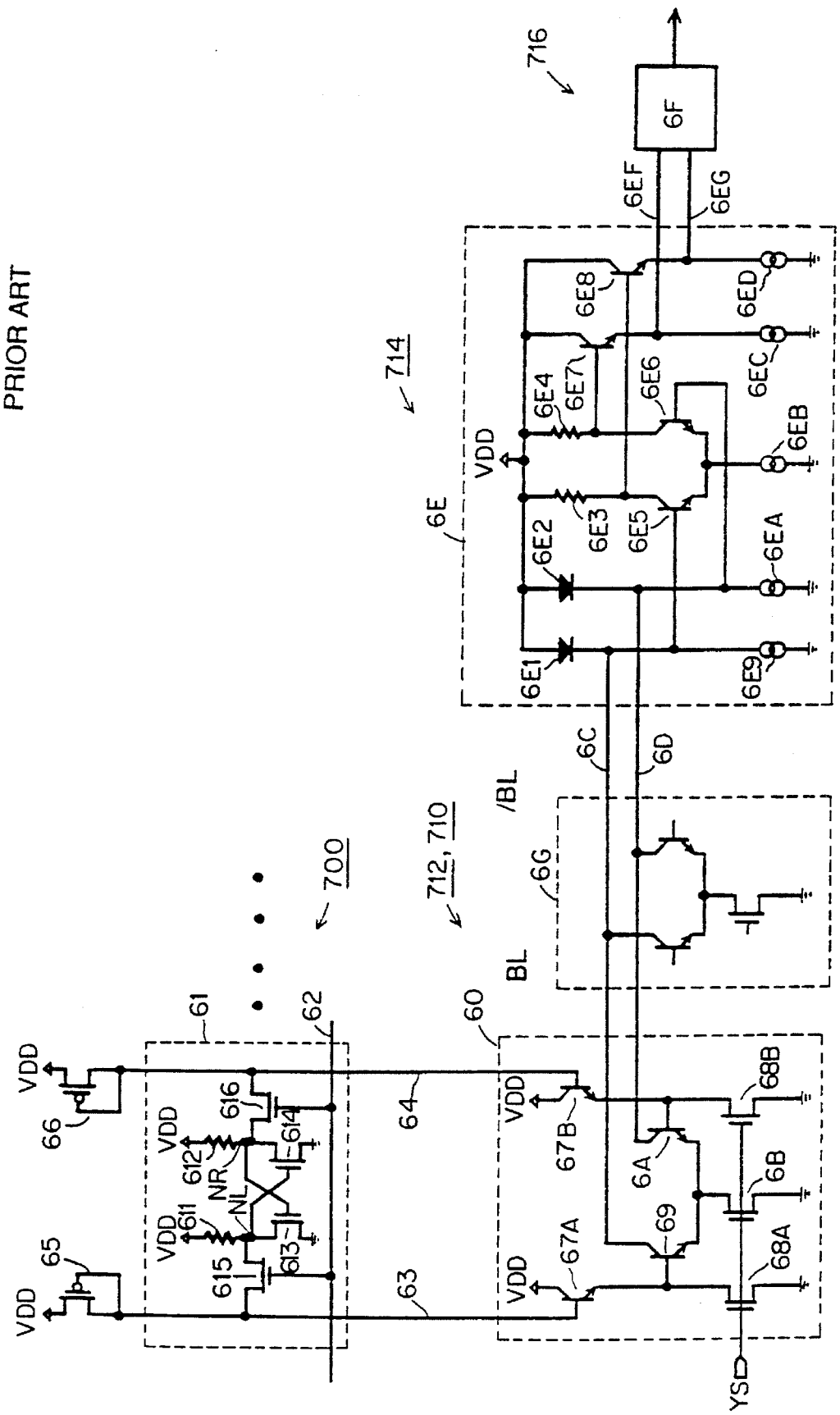
FIG. 15 illustrates the structure of a conventional sense amplifier circuit.

Similarly to the previous description with reference to the sense amplifier circuit shown in FIG. 15, it is assumed that a sense current flows to the data line 6C in accordance with the data held in the selected memory cell.

The diode 11 and the bipolar transistor 13 form a current mirror circuit, while the diode 12 and the bipolar transistor 14 form another current mirror circuit. A current flowing through the diode 11 is equal to that flowing through the bipolar transistor 13, while a current flowing through the diode 12 is equal to that flowing through the bipolar transistor 14.

The current flowing through the bipolar transistor 13 is equal to that flowing in the MOS transistor 15, while the current flowing through the bipolar transistor 14 is equal to that flowing in the MOS transistor 16. The MOS transistors 15 and 16 form a current mirror circuit.

Since the sense current flows to the data line 6C, the sum current of this sense current, i.e., a current ISN supplied by the transistor 6B of the first sense amplifier 60 and a current ICS supplied by the current source 18, flows through the diode 11 and through the bipolar transistor 13 by a current mirror operation. On the other hand, only a current ICS supplied by the current source 19 flows through the diode 12. The current flowing out from the bipolar transistor 13 becomes larger than that flowing out from the bipolar transistor 14. Therefore, the current flowing through the MOS transistor 16 becomes larger than that supplied by the bipolar transistor 14, and the output node 1B is discharged by the MOS transistor 16 to the ground potential.

The speed of a potential change at the output node 1B is increased as the current flowing through the MOS transistor 16 is increased in excess of that supplied by the bipolar transistor 14. Flowing out from the bipolar transistor 14 is the current ICS supplied by the current source 19, while flowing in the MOS transistor 16 is the sum of the sense current ISN and the current ICS supplied by the current source 18. The sense current is set to be much greater than the current ICS (ISN>ICS), in order to sufficiently increase the ratio of (ICS+ISN) to ICS. This structure is implemented by sufficiently increasing current drivability of the transistor 6B as compared with transistors forming the current sources 18 and 19, as hereinafter described in detail.

In order to minimize the sense time for performing a sensing operation at a high speed, it is necessary to minimize the potential difference of each of the data lines 6C and 6D between the cases of flow and no flow of the sense current.

The current sources 18 and 19 supply steady-state currents to the diodes 11 and 12. It is possible to reliably develop forward voltage drops across the diodes 11 and 12 and to reliably fix the potentials of the data lines 6C and 6D at VDD−VBE=VDD−0.8 V, where VBE represents the forward voltage drops of the diodes 11 and 12.

The current difference developed between the data lines 6C and 6D is detected by a current mirror circuit. Thus, it is possible to execute a sensing operation at a higher speed than the structure shown in FIG. 15, which in turn is adapted to detect and differentially amplifying small potential swings of the data lines.

Description is now made on an operation with the sense current flowing in the data line 6D. In this case, the current supplied by the bipolar transistor 14 exceeds that flowing through the MOS transistor 16. The current flowing through the MOS transistor 16 is ICS, and that flowing out from the bipolar transistor 14 is ISN+ICS. Therefore, the output node 1B is charged by the bipolar transistor 14, so that its potential is increased.

When the potential of the output node 1B is increased and emitter-to-collector potential difference of the bipolar transistor 14 is reduced below 0.6 V, a saturation phenomenon is caused in the bipolar transistor 14 to deteriorate its performance in operating speed. This deteriorates operating characteristics of the sense amplifier 600A. Namely, if the bipolar transistor 14 has a base potential of VDD–0.8 V and an emitter potential of VDD and a collector potential exceeding VDD–0.6 V, both base-emitter and base-collector potentials are biased in the forward direction. While an emitter-to-collector saturation voltage VCESAT of a bipolar transistor is determined in the specification in general, such an emitter-to-collector saturation voltage CVESAT is 0.6 V in a PNP bipolar transistor.

The clamp circuit 1A is provided to prevent the aforementioned saturation of the PNP bipolar transistor 14. This clamp circuit 1A clamps the high potential level of the output node 1B such that the potential of the output node 1B will not exceed VDD–0.6 V. Due to this function of the clamp circuit 1A, it is possible to drive the bipolar transistor 14 in a nonsaturated state as well as to maximize the potential swing in the output node 1B. In other words, it is possible to set the potential swing of the output node 1B to a range of VDD–0.6 V.

As hereinabove described, it is possible to execute a sensing operation at a high speed by converting current changes themselves appearing on the data lines 6C and 6D to potential changes by the current mirror circuit.

FIGS. 2A and 2B illustrate exemplary structures of the current source 18 or 19 shown in FIG. 1. The current source shown in FIG. 2A is formed by a MOS transistor. Referring to FIG. 2A, the MOS transistor forming the current source has a gate which is connected to receive the source potential VDD and a source which is connected to receive the ground potential serving as the second source potential. The MOS transistor can supply a current which is proportional to the square of its gate potential. When the gate potential is constant with respect to the power source potential VDD, the MOS transistor can supply a constant current.

The current source shown in FIG. 2B is formed by an NPN bipolar transistor and a resistance. Referring to FIG. 2B, the current source 18 (or 19) includes an NPN bipolar transistor PT having a base which is connected to receive a prescribed reference voltage VCS and an emitter which is connected to receive the ground potential through an emitter resistance RE. Assuming that RE represents the resistance value of the resistance RE and VBE represents a base-to-emitter voltage, this bipolar transistor PT can supply the following emitter current IE:

$$IE=(VCS-VBE)/RE$$

Hence, the collector current ICS is expressed as follows:

$$ICS=\alpha \cdot IE$$

where α represents a common base current amplification factor of the bipolar transistor PT.

In either one of the structures shown in FIGS. 2A and 2B, it is possible to regularly supply a current of a prescribed value.

The current source shown in FIG. 2A or 2B supplies the current to the current mirror circuit. The currents ICS flowing through the clamp diodes 11 and 12 forming the current mirror circuits are reduced to be sufficiently smaller than the sense current. This structure is now described.

FIG. 3 illustrates exemplary structures of the current sources 6B, 18 and 19 shown in FIG. 3. Referring to FIG. 3, the current source of the first sense amplifier 60, i.e., the N-channel MOS transistor 6B, receives a constant voltage VG1 at its gate. This reference voltage VG1 supplied by a bit line selection signal having a high potential level of the power source voltage VDD.

The current sources 18 and 19 comprise N-channel MOS transistors which receive a reference voltage VG0 from a reference voltage generation circuit RVG at gates thereof. The reference voltage generation circuit RVG includes a resistance R0 having an end which is connected to the source voltage VDD, and diode-connected N-channel MOS transistors TR1, TR2 and TR3 which are connected in series between another end of the resistance R0 and the ground potential. The reference voltage VG0 is expressed as 3·Vth, where Vth represents the threshold voltage of the transistors TR1 to TR3. In this case, VG1 is greater than VG0, and the transistor 6B can generate a sense current ISN which is sufficiently larger than the currents supplied by the current sources 18 and 19.

Even when no reference voltage generation circuit RVG is employed and the source voltage VDD is directly supplied to the gates of the MOS transistors forming the current sources 18 and 19, it is possible to satisfy the relation of ISN>ICS by setting gate widths (channel widths) of the transistors as W1>W0, where W1 represents the channel width (gate width) of the transistor 6B and W0 represents the channel width (gate width) of the MOS transistors forming the current sources 18 and 19. These two methods may be combined with each other.

Figure 4A:
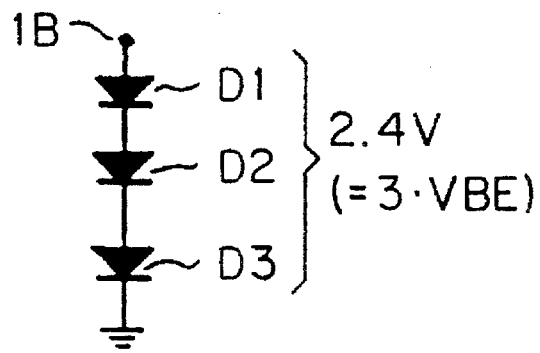
FIGS. 4A and 4B illustrate exemplary structures of a clamp circuit shown in FIG. 1.
Figure 4B:
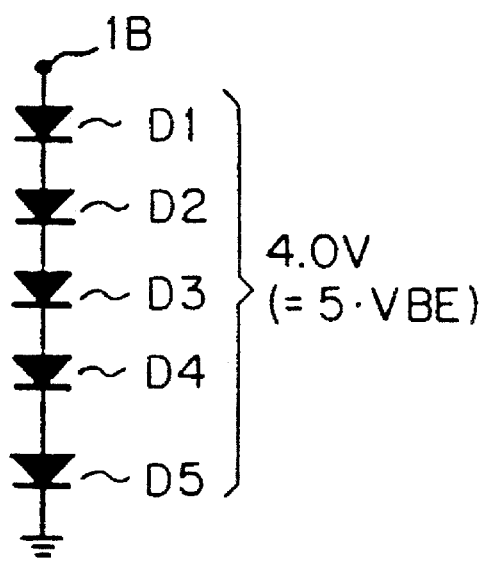

FIGS. 4A and 4B illustrate exemplary structures of the clamp circuit 1A shown in FIG. 1.

The clamp circuit 1A shown in FIG. 4A is applied to a structure of source voltage VDD of 3 V, while that shown in FIG. 4B is applied to a structure of source voltage VDD of 5 V. Referring to FIG. 4A, the clamp circuit 1A includes diodes D1, D2 and D3 which are connected in series between the output node 1B and the ground potential. Assuming that each of the diodes D1 to D3 has a forward voltage drop VBE of 0.8 V, a high potential level of the output node 1B is clamped at 2.4 V. In this case, it is possible to prevent the collector-to-emitter potential difference of the PNP bipolar transistor 14 from reduction below 0.6 V.

The clamp circuit 1A shown in FIG. 4B includes diodes D1, D2, D3, D4 and D5 which are connected in series between the output node 1B and the ground potential. Assuming that each of the diodes D1 to D5 has a forward voltage drop VBE of 0.8 V, the high potential level of the output node 1B is clamped at 4.0 V. In this case, the base-to-emitter potential difference of the PNP bipolar transistor 14 shown in FIG. 1 will not be reduced below 1.0 V, and it is possible to reliably prevent the PNP bipolar transistor 14 from entering a saturated state.

When the clamp circuit 1A shown in FIG. 4A or 4B is employed, the potential swing at the output node 1B is determined by the clamping potential of this clamp circuit 1A. Namely, the potential swing can be set in a range up to 2.4 V when the source voltage VDD is 3 V in the structure of FIG. 4A, while it is possible to set the potential swing in a range up to 4.0 V in the structure shown in FIG. 4B. In the PNP bipolar transistor 14, the emitter-to-collector potential difference has only to be in excess of 0.6 V. When the source voltage VDD is 5 V, therefore, the maximum level of the clamping potential of the clamp circuit 1A can be set at 4.4 V. In this case, the output potential swing can be set in a range up to 4.4 V at the maximum. As compared with the condition of the potential swing of not more than 0.8 V in the conventional sense amplifier circuit shown in FIG. 15, it is possible to cope with an interface other than an ECL interface, with no level conversion.

The sense amplifier circuit shown in FIG. 1 utilizes PNP and NPN bipolar transistors. When both of such PNP and NPN bipolar transistors are integrated on a P-type semiconductor substrate in the same structure in a bipolar integration technique which is employed for fabricating a linear integrated circuit, transistor fabrication steps are increased with a complicated fabrication process. In general, therefore, NPN and PNP bipolar transistors are prepared in different structures.

Figure 5A:
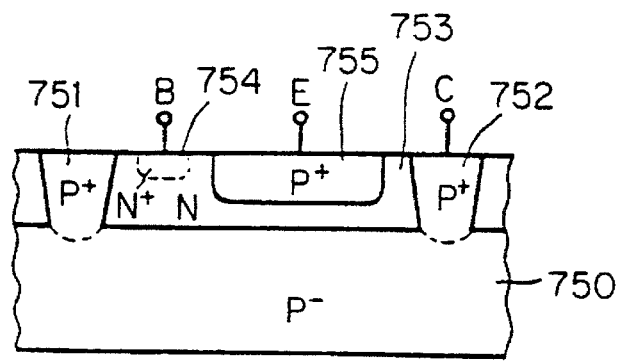
FIGS. 5A and 5B schematically illustrate sectional structures of bipolar transistors employed in conventional linear integrated circuits.

FIG. 5A shows a sectional structure of a PNP bipolar transistor which is employed in a conventional linear integrated circuit. Referring to FIG. 5A, the PNP bipolar transistor includes an N-type island region 753 which is formed on a P-type semiconductor substrate 750 of low impurity concentration, and a high impurity concentration N-type region 754 and a high impurity concentration P-type region 755 which are formed on a surface of the island region 753 and are separated from each other. The island region 753 is isolated from other elements by P-type regions 751 and 752 of high impurity concentration. In general, the P-type regions 751 and 752 and the P-type island region 753 are held in reverse-biased states.

In the PNP transistor shown in FIG. 5A, the P-type region 752 is connected to a collector electrode C and the P-type region 755 is connected to an emitter electrode E, while the N-type region 754 is connected to a base electrode B. Namely, the substrate 750 serves as a collector and the N-type island region 754 serves as a base region, to provide a vertical transistor structure. In the PNP bipolar transistor shown in FIG. 5A, no buried layer is formed between the N-type island region 753 and the P-type substrate 750. This PNP bipolar transistor is restricted to such an application that the collector is normally at a substrate potential (minimum potential). Therefore, the transistor structure shown in FIG. 5A cannot be applied to the second sense amplifier shown in FIG. 1.

Figure 5B:
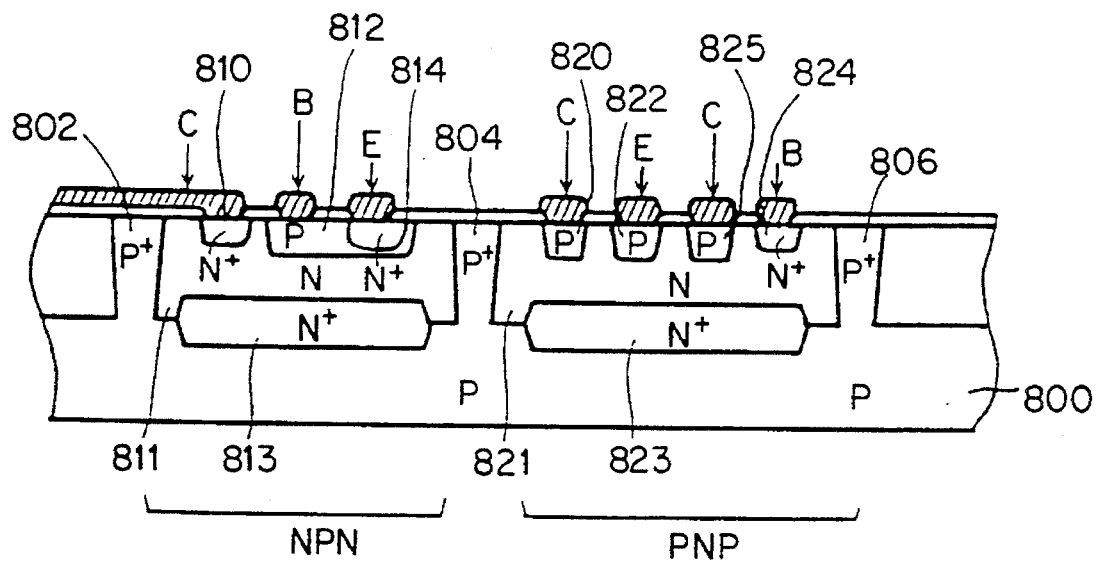

In the linear integration technique of integrating both PNP and NPN bipolar transistors on the same semiconductor substrate, a transistor structure shown in FIG. 5B is employed in general.

FIG. 5B illustrates a sectional structure of transistors which are employed in a conventional linear integrated circuit (bipolar integrated circuit). In the integrated circuit shown in FIG. 5B, NPN and PNP bipolar transistors are integrated on the same P-type semiconductor substrate 800. In the integrated circuit shown in FIG. 5B, N-type element forming regions 811 and 821 are isolated from each other by P-type regions 802, 804 and 806 of high impurity concentration. N-type regions 813 and 823 of high impurity concentration are formed on bottom portions of the element forming regions 811 and 821 respectively. The high impurity concentration N-type regions 813 and 823, which are called deep collectors or floating collectors, have functions of reducing resistances of the element forming regions 811 and 821.

The NPN bipolar transistor includes an N-type region 810 of high impurity concentration which is formed on the surface of the element forming region 811, a high impurity concentration N-type region 814 which is isolated from the N-type region 810, and a P-type region 812 which is formed adjacent to the N-type region 814. The P-type region 812 may be formed to surround the N-type region 814. The N-type region 810 is connected to a collector electrode C and the N-type region 814 is connected to an emitter electrode E, while the P-type region 812 is connected to a base electrode B. The element forming region 811 serves as a collector.

The PNP bipolar transistor includes P-type regions 820, 822 and 825 and an N-type region 824 of high impurity concentration which are formed on the surface of the N-type type element forming region 821. The P-type regions 820, 822 and 825 are formed in the same manufacturing step as the P-type region 812. The P-type region 822 is connected to an emitter electrode E and the P-type regions 820 and 825 are connected to a collector electrode C, while the N-type region 824 is connected to a base electrode B. The N-type element forming region 821 serves as a base.

The PNP bipolar transistor shown in FIG. 5B can be formed in the same fabrication step as that for forming the base of the NPN bipolar transistor, whereby no fabrication step is added. The PNP bipolar transistor shown in FIG. 5B has a lateral structure with the N-type region 821 serving as a base to provide a lateral operation. Such a lateral PNP bipolar transistor generally has a low cut-off frequency and a small amplification factor, and its operating speed performance is slightly reduced. Further, it is difficult to highly integrate the structure of the PNP bipolar transistor shown in FIG. 5B, which requires the four impurity regions 820, 822, 825 and 824 on the surface of the N-type region 821. A PNP bipolar transistor having a structure which is suitable for high integration is now described.

Figure 6:
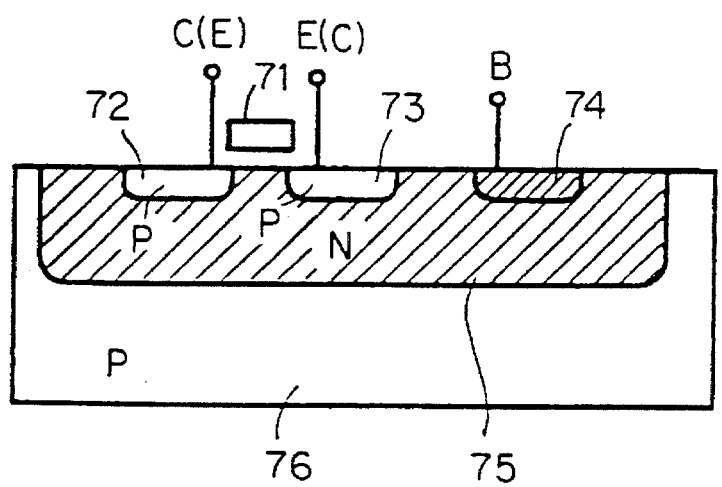
FIG. 6 illustrates an exemplary sectional structure of a PNP bipolar transistor employed in the sense amplifier circuit according to the present invention.

FIG. 6 illustrates a sectional structure of an improved PNP bipolar transistor which is employed for the sense amplifier circuit of the invention. Referring to FIG. 6, the PNP bipolar transistor includes P-type impurity regions 72 and 73 and an N-type impurity region 74 of high impurity concentration which are formed on the surface of an N-type well 75 provided on the surface of a P-type substrate 76. The PNP bipolar transistor shown in FIG. 6 can be implemented only by CMOS fabrication processes. This PNP bipolar transistor has the same structure as a P-channel MOS transistor in a CMOS transistor. In such a P-channel MOS transistor, the impurity regions 72 and 73 correspond to source and drain regions, while the impurity region 74 corresponds to a bias voltage application region for a well. The space between the P-type impurity regions 72 and 73 is decided by a gate electrode 71. In other words, the impurity regions 72 and 73 are formed in a self alignment manner with respect to the gate electrode 71. The impurity region 72 is connected to a collector electrode C (or an emitter electrode E) and the P-type impurity region 73 is connected to the emitter electrode E (or the collector electrode C), while the N-type impurity region 74 is connected to a base electrode B.

The PNP bipolar transistor shown in FIG. 6 has a lateral structure with the N-type well 75 serving as a base. The distance between the impurity regions 72 and 73, i.e., the base width, is decided by the gate electrode 71. This base width corresponds to a channel length in a MOS transistor. In the structure shown in FIG. 6, therefore, the base width can be accurately minimized to provide a PNP bipolar transistor which is suitable for high integration with no addition of a new fabrication step.

Figure 7:
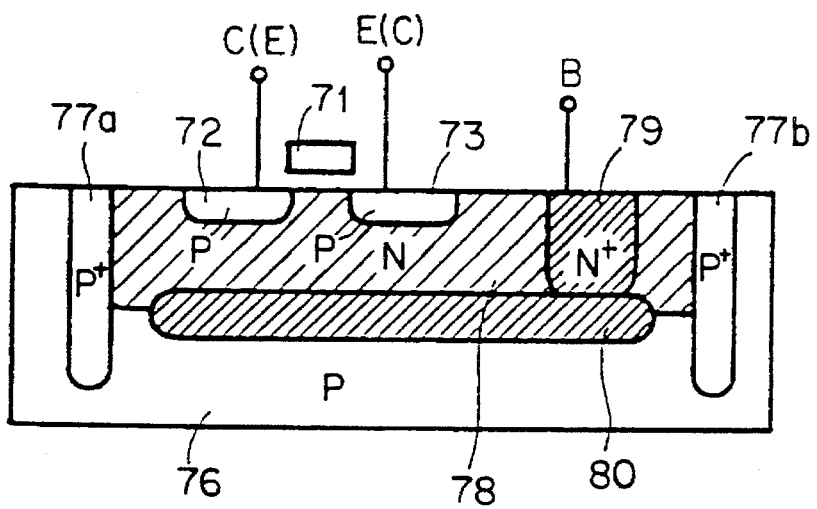
FIG. 7 illustrates another exemplary sectional structure of a PNP bipolar transistor employed in the sense amplifier circuit according to the present invention.

FIG. 7 illustrates a sectional structure of another improved PNP bipolar transistor which is employed for the sense amplifier circuit of the invention. The PNP bipolar transistor shown in FIG. 7 is formed by a so-called BiCMOS fabrication process for fabricating an NPN bipolar transistor and a CMOS transistor, with no additional fabrication step. Referring to FIG. 7, the PNP bipolar transistor is formed on a P-type substrate 76, and isolated from adjacent elements by P-type regions 77a and 77b of high impurity concentration serving as element isolation regions. This PNP bipolar transistor includes an N-type region 78 whose area is decided by the impurity regions 77a and 77b, an N-type region 80 of high impurity concentration which is formed on a bottom portion of the N-type region 78, P-type impurity regions 72 and 73 which are formed on the surface of the N-type region 78, and an N-type region 79 of high impurity concentration which is so formed on a surface portion of the N-type region 78 as to reach the N-type region 80. A distance between the P-type type regions 72 and 73 is decided by a gate electrode 71. In other words, the impurity regions 72 and 73 are formed in a self alignment manner with respect to the gate electrode 71. The P-type region 72 is connected to a collector electrode C (or an emitter electrode E) and the P-type region 73 is connected to the emitter electrode E (or the collector electrode C), while the N-type region 79 is connected to a base electrode B.

The PNP bipolar transistor shown in FIG. 7 is formed in the same steps as those for forming an element isolation region, a floating collector (N-type region 80) and a collector electrode region 79 in an NPN bipolar transistor. The impurity regions 72 and 73 and the gate electrode 71 are formed in the same steps as those for fabricating the P-channel MOS transistor, similarly to the bipolar transistor shown in FIG. 6. Thus, the PNP bipolar transistor can be formed with no additional fabrication step.

The PNP bipolar transistor shown in FIG. 7 has a lateral structure with the N-type region 78 serving as a base (serving as a collector in an NPN bipolar transistor). The base width is decided by the gate electrode 71. Therefore, it is possible to accurately minimize the transistor size similarly to the transistor structure shown in FIG. 6, and the transistor size can be further reduced as compared with that shown in FIG. 6 due to employment of the isolation regions 77a and 77b in place of a field oxide film (LOCOS film). Due to the high impurity concentration region 80 serving as a floating collector, further, the base resistance is so reduced that it is possible to further improve performance.

It is possible to form a lateral PNP bipolar transistor in a minimized transistor size with no additional fabrication step by forming collector and emitter regions of a PNP bipolar transistor in the same steps as those for fabricating a MOS transistor, as shown in FIG. 6 or 7.

[Embodiment 2]

Figure 8:
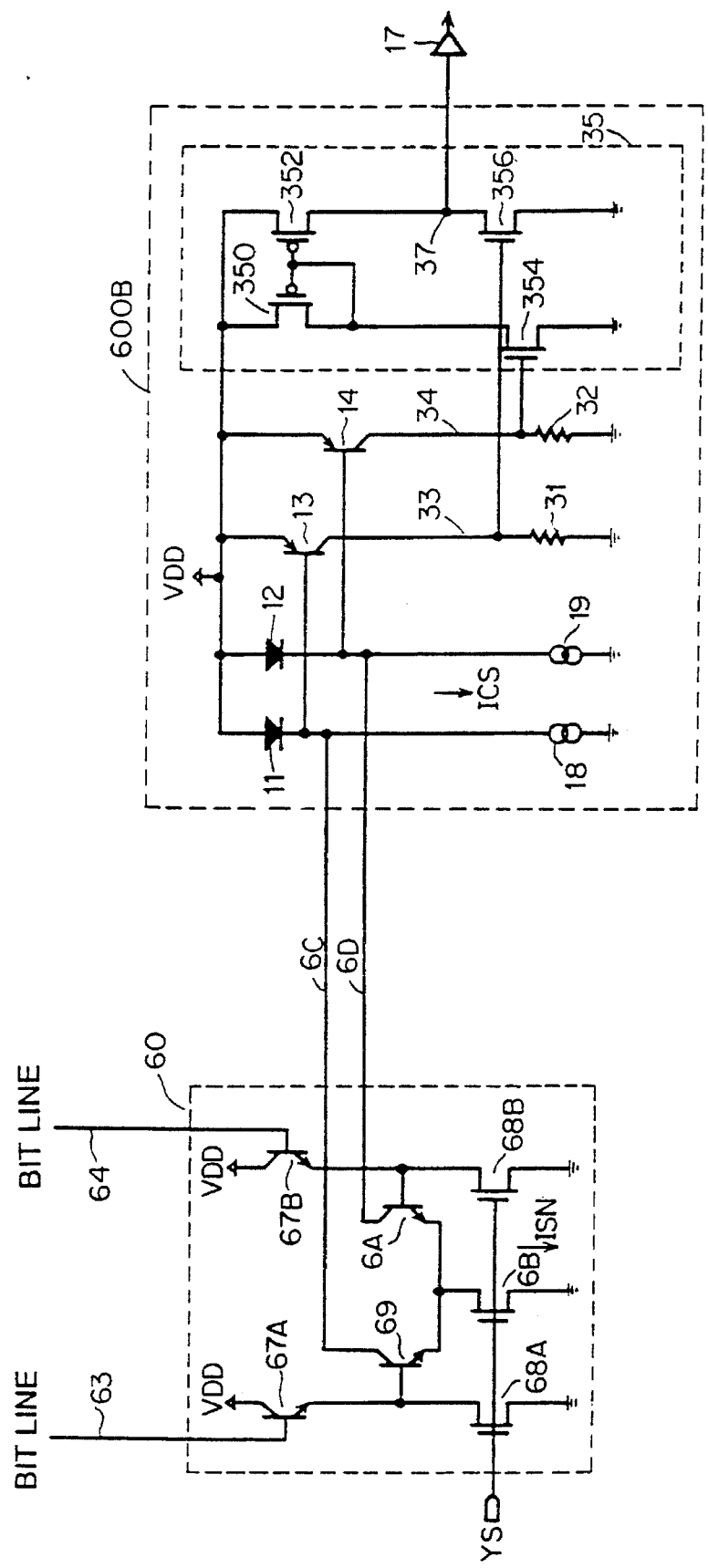
FIG. 8 illustrates the structure of a sense amplifier circuit according to a second embodiment of the present invention.

FIG. 8 illustrates the structure of a sense amplifier circuit according to a second embodiment of the present invention. Referring to FIG. 8, a second sense amplifier 600B includes a resistance element 31 which is connected between a collector of a PNP bipolar transistor 13 and a second source potential (ground potential), another resistance element 32 which is connected between a collector of another PNP bipolar transistor 14 and the ground potential, and a voltage amplifier 35 which amplifies voltages appearing at collector nodes 33 and 34 of the PNP bipolar transistors 13 and 14.

The voltage amplifier 35 includes an N-channel MOS transistor 356 which receives the potential of a collector node 33 at its gate, another N-channel MOS transistor 354 which receives the potential of the collector node 34 at its gate, and P-channel MOS transistors 350 and 352 for supplying currents to the transistors 354 and 356. The P-channel MOS transistors 350 and 352 form a current mirror circuit, and the gates of these transistors 350 and 352 are connected to a drain node of the transistor 354. The transistor 350 supplies a current to the transistor 354, while the transistor 352 supplies a current to the transistor 356. A drain node of the transistor 356 serves as an output node.

A first sense amplifier 60 has a structure similar to that shown in FIG. 1, and hence corresponding parts are denoted by the same reference numerals, to omit detailed description. The operation is now described.

It is assumed here that a sense current ISN flows a data line 6C. In this case, a current ISN+ICS flows from the PNP bipolar transistor 13, while a current ICS flows from the PNP bipolar transistor 14. The potential of the node 33 becomes (ISN+ICS)·R31 and that of the node 34 becomes ICS·R32, where R31 and R32 represent resistance values of the resistance elements 31 and 32. The resistance elements 31 and 32 have the same resistance values (R31=R32). Therefore, the potential of the node 33 exceeds that of the node 34. Such potential difference between the nodes 33 and 34 is amplified by the voltage amplifier 35, and supplied to a buffer circuit 17.

More specifically, the conductance of the transistor 356 exceeds that of the transistor 354 in the voltage amplifier 35. The transistors 350 and 352 supply similar currents. Since the transistor 354 has a small conductance, gate potentials of the transistors 350 and 352 are increased so that the amounts of currents flowing in the transistors 350 and 352 are reduced. An output node 37 of the voltage amplifier 35 is discharged to the ground potential by the transistor 356, to reach a low potential level.

When the sense current ISN flows on the data line 6D, on the other hand, the amount of the current supplied by the transistor 352 exceeds that of the current discharged by the transistor 356, whereby the output node 37 is charged up to a high potential.

In the structure of the second sense amplifier 600B shown in FIG. 8, current outputs of a current mirror circuit formed by a diode 11 and the bipolar transistor 13 and that formed by another diode 12 and the bipolar transistor 14 are converted to voltage signals by the resistance elements 31 and 32 respectively. The voltage signals thus converted by the resistance elements 31 and 32 are amplified by the voltage amplifier 35. The resistance elements 31 and 32 have specific resistance values. The collector nodes 33 and 34 will not enter high impedance states. The maximum potentials thereof are decided by collector currents supplied by the bipolar transistors 13 and 14 and the resistance values of the resistance elements 31 and 32. Therefore, it is possible to prevent the bipolar transistors 13 and 14 from entering saturated states by setting the resistance values at appropriate levels. In this case, therefore, no clamp circuit 1A as shown in FIG. 1 is required and the number of circuit elements can be reduced.

The resistance elements 31 and 32, which prevent the collectors of the bipolar transistors 13 and 14 from entering high impedance states, also provide the following advantage.

When the collector node of the PNP bipolar transistor 13 goes from a high potential to a low potential level in the structure shown in FIG. 1, this collector node is discharged through the N-channel MOS transistor 15, so that the N-channel MOS transistor 15 finally enters a high impedance state. Along such transition of the MOS transistor 15 to a high impedance state, the N-channel MOS transistor 16 enters a nonconducting state and the output node 1B is charged by the bipolar transistor 14 at a high speed. In this case, it is difficult to discharge the gate potential of the transistor 16 since the N-channel transistor 15 enters a high impedance state, and hence a little more time is required for the transistor 16 to enter a nonconducting state. Thus, the transition of the output node 1B from a low potential to a high potential may be slowed.

In the structure shown in FIG. 8, the collector node 33 of the PNP bipolar transistor 13 is connected to the ground potential through the resistance element 31. Therefore, the collector node 33 is discharged at a high speed and the potential of the output node 37 of the voltage amplifier 35 is determined also at a high speed. This also applies to the collector node 34 of the PNP bipolar transistor 14. Thus, it is possible to prevent the collector nodes 33 and 34 from entering high impedance states by connecting the collector nodes 33 and 34 to the ground potential with constant resistance value elements, thereby executing a sensing operation at a high speed.

[Embodiment 3]

Figure 9:
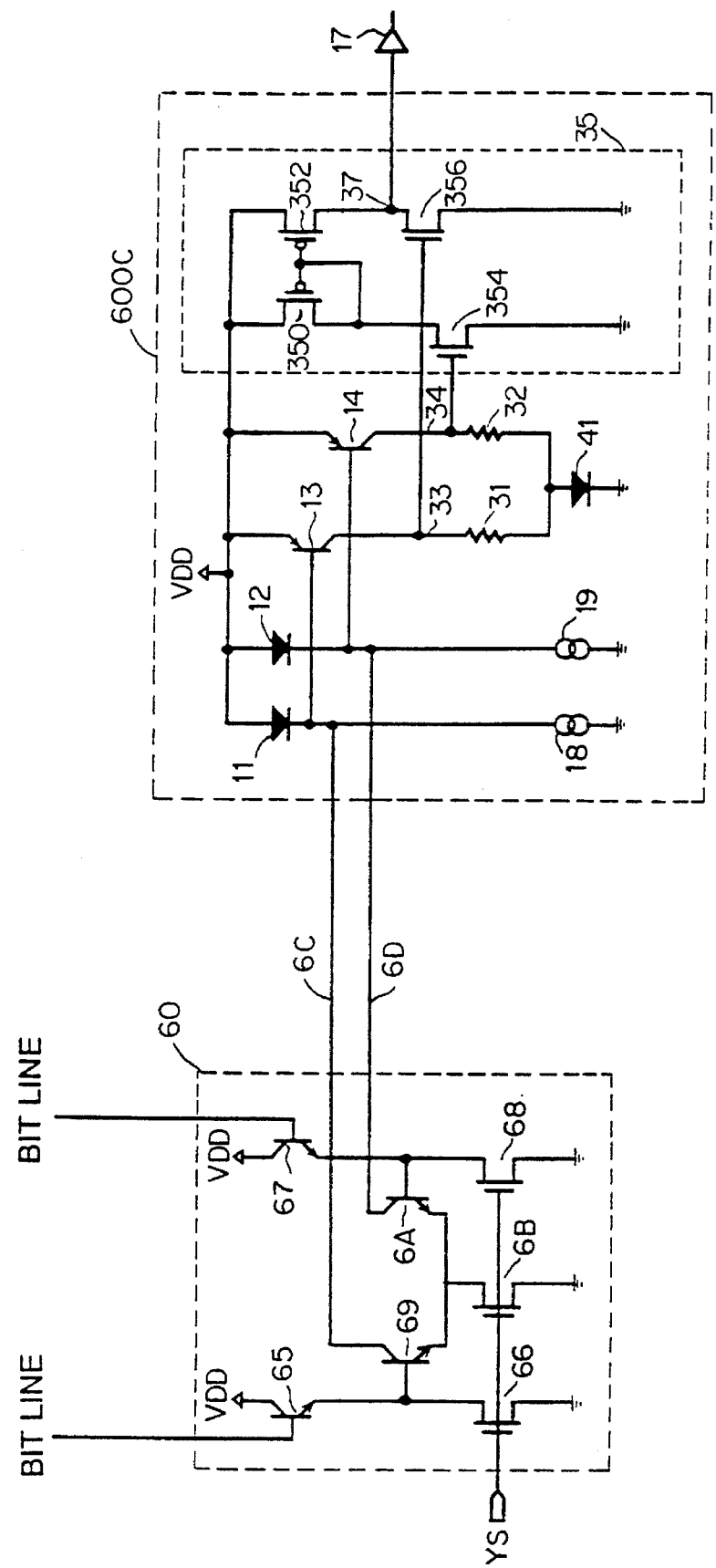
FIG. 9 illustrates the structure of a sense amplifier circuit according to a third embodiment of the present invention.

FIG. 9 illustrates the structure of a sense amplifier circuit according to a third embodiment of the present invention. Referring to FIG. 9, a second sense amplifier 600C further comprises a diode 41 which is connected between resistance elements 32 and 31 and the ground potential, in addition to the structure of the second sense amplifier 600B shown in FIG. 8. Other structure is identical to that shown in FIG. 8, and corresponding portions are denoted by the same reference numerals.

In the structure shown in FIG. 9, a current regularly flows in the diode 41. Thus, the diode 41 can reliably serve as a clamp diode, so that collector nodes 33 and 34 of bipolar transistors 13 and 14 are reliably provided with an offset of a forward voltage drop of 0.8 V of this diode 41. Thus, it is possible to reduce potential swings of the collector nodes 33 and 34 by the offset amount of 0.8 V, thereby executing a sensing operation at a higher speed.

[Embodiment 4]

Figure 10:
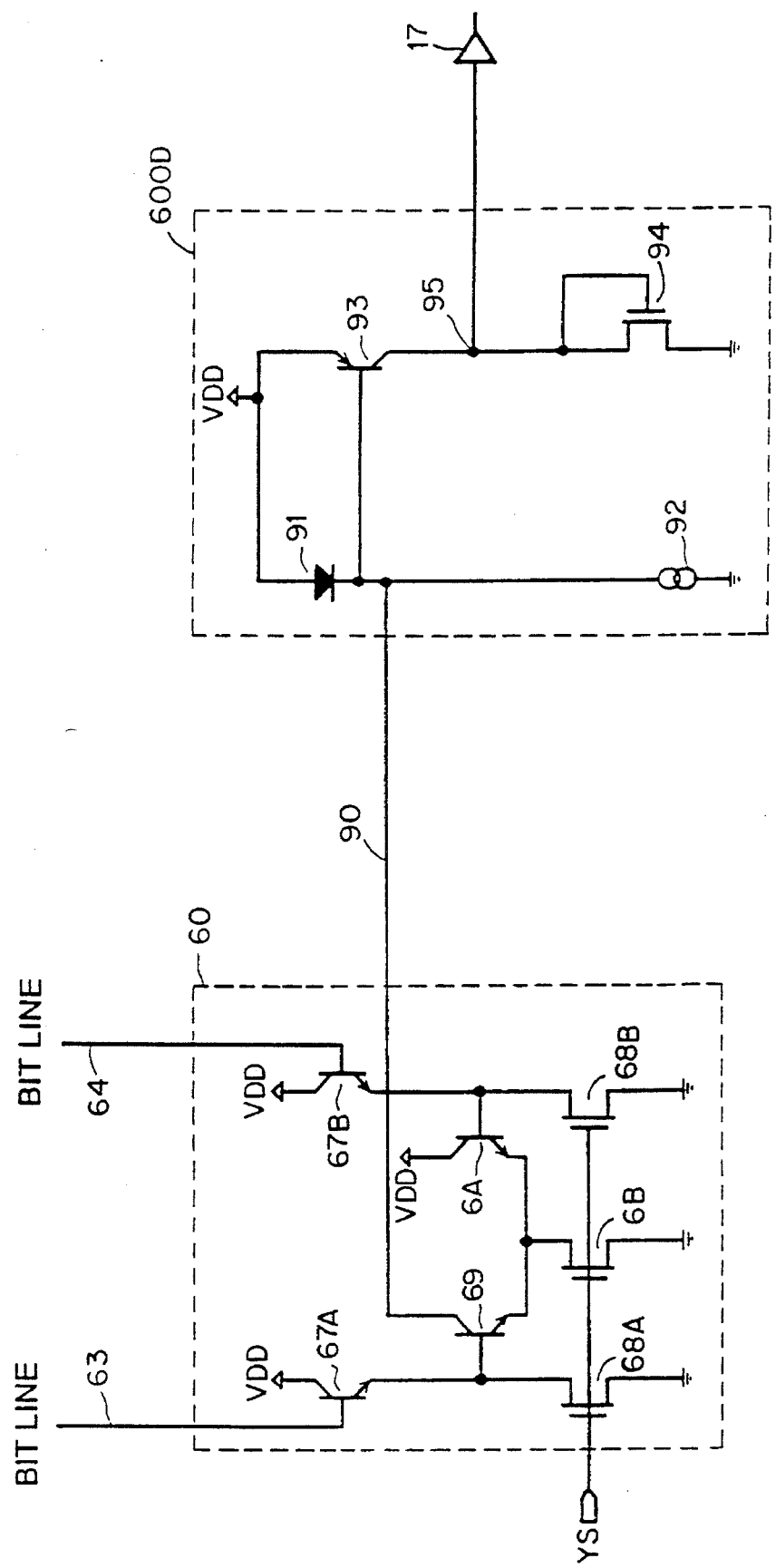
FIG. 10 illustrates the structure of a sense amplifier circuit according to a fourth embodiment of the present invention.

FIG. 10 illustrates the structure of a sense amplifier circuit according to a fourth embodiment of the present invention. Referring to FIG. 10, a first sense amplifier 60 is identical in structure to those shown in FIGS. 1, 8 and 9, except that a collector of a transistor 6A is connected to source potential VDD.

A data line 90 is provided between the first sense amplifier 60 and a second sense amplifier 600D. This data line 90 is connected to a collector of a transistor 69 which is provided in the first sense amplifier 60. The second sense amplifier 600D includes a diode 91 for clamping the potential of the data line 90, a PNP bipolar transistor 93 forming a current mirror circuit with the diode 91, a diode-connected N-channel MOS transistor 94 which is connected between an output node 95 and the ground potential for serving as a resistance, and a current source 92 for regularly supplying a current to the diode 91. The N-channel MOS transistor 94 may be replaced by a resistance element. The operation is now described.

A sense current appears on the data line 90 in accordance with data held in a memory cell appearing on a bit line 63. The sense current flows to the data line 90 when the bit line 63 is at a high potential, while no sense current flows to the data line 90 if the bit line 63 is at a low potential. A sum current of the sense current flowing in the data line 90 and the current supplied by the current source 92 flows through the diode 91. A collector current which is responsive to presence/absence of the sense current flows through the PNP bipolar transistor 93. The collector current of the transistor 93 is converted to a voltage signal by the N-channel MOS transistor 94. The potential of the output node 95 goes high when the sense current is present, while the same goes low when no sense current is present. The voltage change of this output node 95 is transmitted to a buffer 17 and amplified thereat.

The N-channel MOS transistor 94 serves as a resistance in the above description. However, this MOS transistor 94 may serve as a diode, since a drain current Id of a MOS diode is generally proportional to the square of the absolute value of a gate voltage Vg, i.e., the potential of the output node 95. It is possible to reliably convert a current change supplied by the bipolar transistor 93. In this case, the sensing operation may be slightly instabilized as compared with a circuit structure employing two data lines 6C and 6D as shown in FIG. 11. While it is possible to sense the potential level at a crossing time Ts in the two data line arrangement, a time of 2·Ts is required for determining the potential level with a single data line arrangement since the potential level is somewhat instabilized upon sensing at the time Ts. However, it is possible to remarkably reduce the number of elements according to the structure shown in FIG. 11.

[Embodiment 5]

Figure 12:
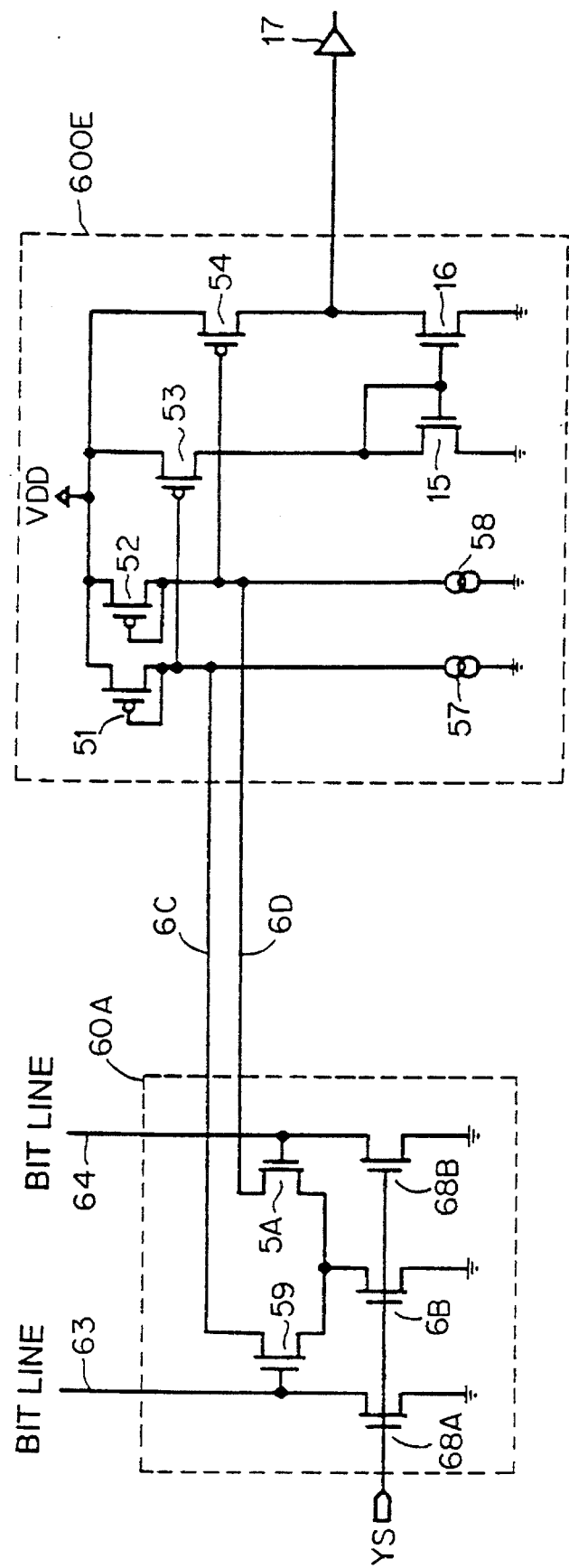
FIG. 12 illustrates the structure of a sense amplifier circuit according to a fifth embodiment of the present invention.

FIG. 12 illustrates the structure of a sense amplifier circuit according to a fifth embodiment of the present invention. Referring to FIG. 12, a first sense amplifier 60A includes an N-channel MOS transistor 59 having a gate which is connected to a bit line 63, an N-channel MOS transistor 5A having a gate which is connected to a bit line 64, an N-channel MOS transistor 6B which couples first conduction terminals (sources) of the transistors 59 and 5A to the ground potential in response to a bit line selection signal YS, and N-channel MOS transistors 68A and 68B which the bit lines 63 and 64 to the ground potential in response to the bit line selection signal YS respectively. The transistors 68A and 68B reduce potential swings of the bit lines 63 and 64 and also drive the transistors 59 and 5A in a linear region (triode region). In other words, the MOS transistors 68A and 68B shift potential levels of the bit lines 63 and 64. High potential levels of the bit lines 63 and 64 are decided by respective ON resistances of the transistors 68A and 68B, while low potential levels thereof are decided by parallel combined resistance value of ON resistance of the drive transistor (transistors 613 and 614 shown in FIG. 15) provided in the memory cell and that of the transistor 68A or 68B.

A second sense amplifier 600E includes diode-connected P-channel MOS transistors 51 and 52 for clamping data lines 6C and 6D at prescribed potentials respectively, a P-channel MOS transistor 53 forming a current mirror circuit with the transistor 51, another P-channel MOS transistor 54 forming another current mirror circuit with the MOS transistor 52, an N-channel MOS transistor 15 receiving a current flowing from the transistor 53, and another N-channel MOS transistor 16 receiving a current flowing from the transistor 54. The transistors 15 and 16 form a current mirror circuit. Gates of these transistors 15 and 16 are connected to a conduction terminal (drain) of the transistor 53.

The second sense amplifier 600E further includes a current source 57 for regularly supplying a current to the transistor 51 and another current source 58 for supplying a current to the transistor 52. The structure shown in FIG. 2A is employed for the current sources 57 and 58.

In the first sense amplifier 60A according to the structure of the sense amplifier circuit shown in FIG. 12, the NPN bipolar transistors 69 and 6A of the first sense amplifier 60 shown in FIG. 1 are replaced by the N-channel MOS transistors 59 and 5A. In the second sense amplifier 600E shown in FIG. 12, the diodes 11 and 12 shown in FIG. 1 are replaced by the P-channel MOS transistors 51 and 52 respectively, while the NPN bipolar transistors 13 and 14 are replaced by the P-channel MOS transistors 53 and 54. No clamp circuit 1A shown in FIG. 1 is provided since the MOS transistor 54 has no P-N junction internally. In other words, no internal forward biased P-N junction exists and it is not necessary to prevent such forward bias.

Operations of the first and second sense amplifiers 60A and 600E shown in FIG. 12 are identical to those of the first and sense amplifiers 60 and 600A shown in FIG. 1, and hence description is omitted.

It is possible to fabricate the sense amplifier circuit shown in FIG. 12, which is formed by only N-channel MOS transistors and P-channel MOS transistors, by CMOS process technique. Thus, fabrication steps can be simplified to reduce the fabrication cost.

In general, a diode employing a MOS transistor is inferior in clamping ability to a PN diode. This clamping ability is briefly described.

Figure 13A:
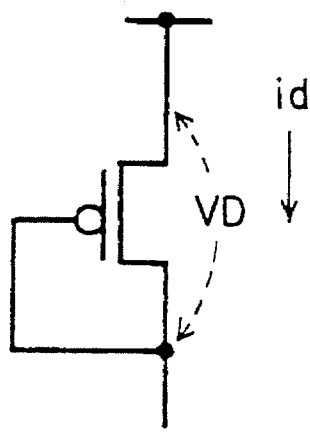
FIGS. 13A to 13C illustrate for comparison clamp abilities of a MOS diode and a PN diode.

FIG. 13A shows a connection of a diode-connected P-channel MOS transistor. Referring to FIG. 13A, a gate and a drain of the P-channel MOS transistor are connected with each other.

Figure 13B:
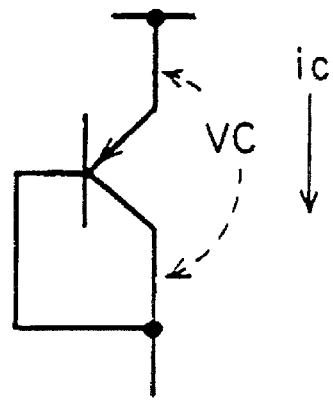

FIG. 13B shows an exemplary structure of a PN diode. Referring to FIG. 13B, the PN diode is comprised of a PNP bipolar transistor having a base and a collector connected with each other. Assuming that VD represents a source-to-drain potential difference of the MOS diode, id represents its drain current, VC represents a collector-to-emitter potential difference of the PN diode and ic represents its collector current as shown in FIGS. 13A and 13B, relations shown in FIG. 13C are obtained.

Figure 13C:
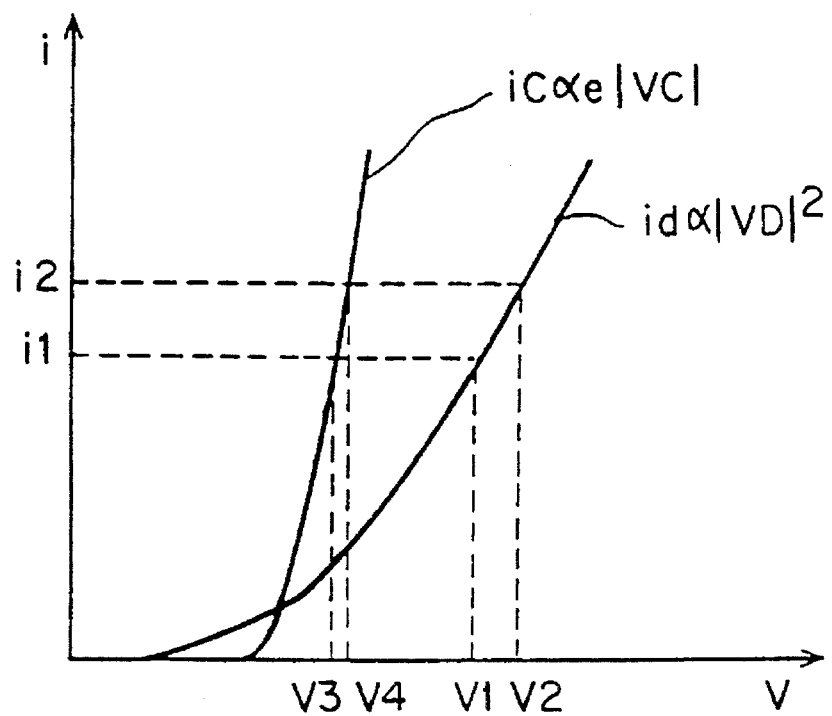
Figure 14:
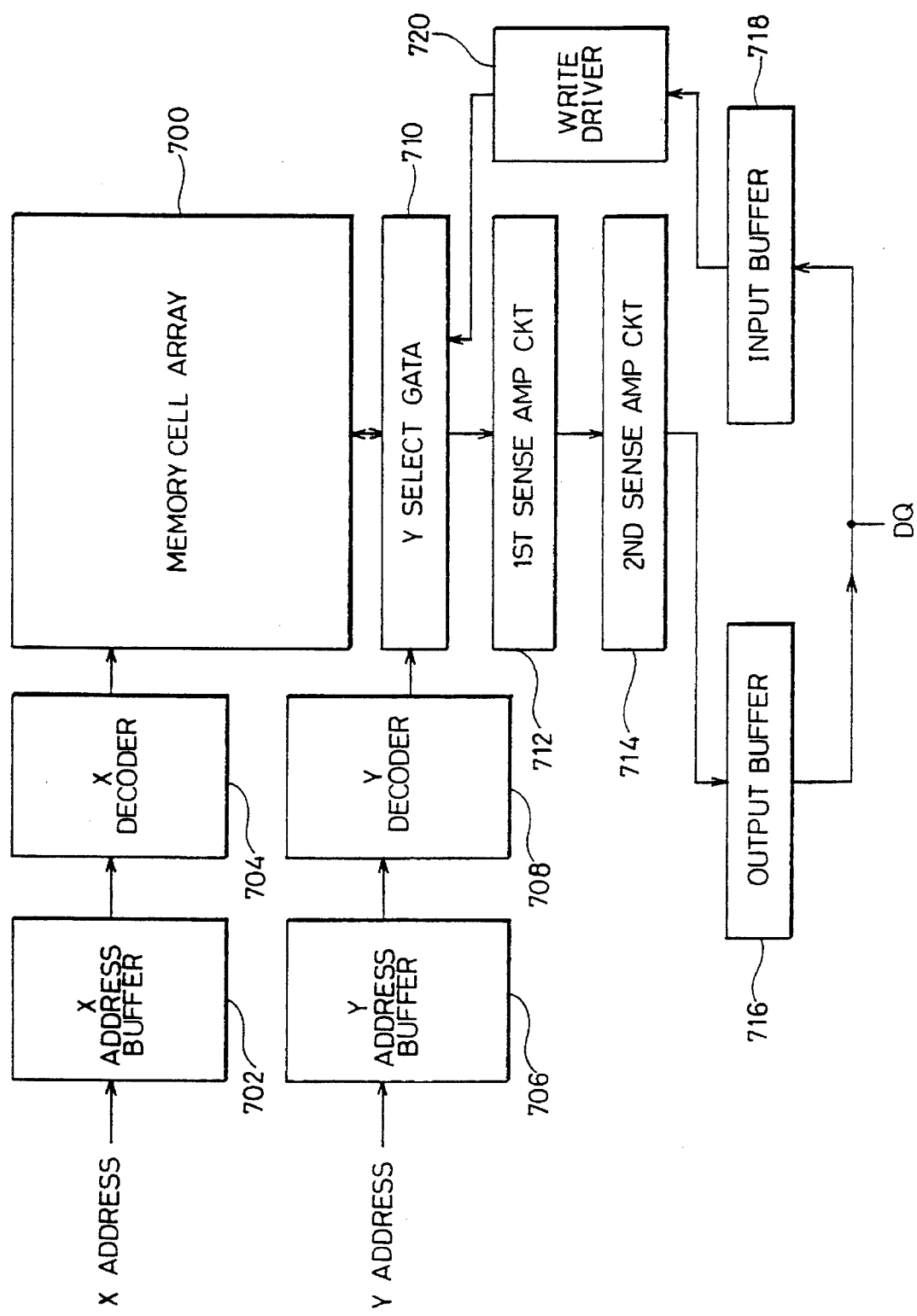
FIG. 14 schematically illustrates the overall structure of a conventional semiconductor memory device.

FIG. 13C illustrates relations of potential difference between the anode and the cathode in each diode and current flowing through the diode. In the MOS diode employing a MOS transistor, the drain current id is proportional to the square of the absolute value of the source-to-drain potential difference VD. In the PN diode, on the other hand, the collector current ic is proportional to an exponential function of the absolute value of the collector-to-emitter potential difference VC. Therefore, the current ic in the PN diode has a steeper rising as compared with the current id of the MOS diode.

When a current i is changed from i1 to i2 in FIG. 13C, the potential difference in the MOS diode is changed from V1 to V2, while that in the PN diode is changed from V3 to V4. It is clearly understood that the potential change in the MOS diode is larger than that in the PN diode.

When the MOS diode is employed, therefore, potential change of data lines caused by presence/absence of a sense current is slightly larger than that in the PN diode arrangement. Therefore, speed performance is slightly deteriorated as compared with the PN diode arrangement. However, this leads to no serious problem since the a current mode operation is performed in the invention, and an effect of reduction in fabrication cost caused by simplification of fabrication steps sufficiently compensates for the disadvantage of deterioration in speed performance.

In each of the first to fifth embodiments, the first sense amplifier is provided for each bit line pair. However, an effect similar to that of each embodiment can be attained also when such a first sense amplifier is provided for a block including a plurality of bit line pairs and only a selected bit line pair provided in the corresponding block is connected to the first sense amplifier. In this case, a column selector gate is provided between the bit line pair and the first sense amplifier to operate in response to a bit line selection signal.

Further, an effect similar to that of each embodiment can be attained also when a memory cell array comprises a plurality of blocks and bit line pairs in only a selected block is connected to first sense amplifiers.

The sense amplifier circuit according to the present invention is applicable to such a structure that current changes are caused in data lines in accordance with data held in a selected memory cell.

According to the present invention, as hereinabove described, a current change caused in data lines is directly converted to a voltage change, whereby it is possible to perform a sensing operation at a high speed without detecting small potential difference appearing on the data lines. When a current mirror circuit is employed, the sense current is doubled since a current identical to the sense current flows in the current mirror circuit, while a current source is required for only clamp means for clamping the data lines. Thus, the number of current sources can be reduced to reduce the current consumption as a whole.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sense amplifier circuit in a semiconductor memory device having a plurality of memory cells each storing information, for detecting and amplifying data of a memory cell selected from said plurality of memory cells, said sense amplifier circuit comprising:

a data line;

first sense means for generating a sense current on said data line in response to said data of the selected memory cell;

clamp means for clamping a potential of said data line at a prescribed potential level;

an element coupled to said clamp means in a current mirror arrangement for effecting the current mirror operation on a current flowing through said clamping means corresponding to said sense current to produce said mirror current; and means coupled to said element and responsive to said mirror current for generating a potential signal according to said mirror current.

2. A sense amplifier circuit in accordance with claim 1, wherein said clamp means includes a diode-connected P-channel insulated gate type transistor, and said element comprises a second P-channel insulated gate type transistor connected with said diode-connected P-channel insulated gate transistor in a current mirror fashion.

3. A sense amplifier circuit in accordance with claim 1, wherein said first sense means receives said data of the selected memory cell through a pair of bit lines transferring complementary data signals, and includes insulated gate type field effect transistors receiving data signals on the pair of bit lines at gates thereof, for differentially amplifying the data signals to generate the sense current on the data line.

4. A sense amplifier circuit in accordance with claim 3, wherein
said clamp means comprises an insulated gate type transistor connected to serve as a diode to clamp the potential on the data line, and
said current mirror type sense means comprises insulated gate type field effect transistors connected to cause a mirror current of a current flowing through said clamp means for amplification of the sense current.

5. A sense amplifier circuit in a semiconductor memory device having a plurality of memory cells each storing information, for detecting and amplifying data of a memory cell selected from said plurality of memory cells, said sense amplifier circuit comprising:
a data line;
first sense means for generating a sense current on said data line in response to said data of said selected memory cell;
a PN diode coupled between a first source potential supply node and said data line for clamping said data line at a predetermined potential;
a PNP bipolar transistor connected with said PN diode in a current mirror arrangement for effecting the current mirror operation on a current flowing through said PN diode corresponding to said sense current to produce a mirror current; and
a converter coupled to said PNP bipolar transistor and responsive to said mirror current for generating a potential signal according to said mirror current.

6. A sense amplifier circuit in a semiconductor memory device having a plurality of memory cells each storing information, for detecting and amplifying data of a memory cell selected from said plurality of memory cells, said sense amplifier circuit comprising:
a data line;
first sense means for generating a sense current on said data line in response to said data of said selected memory cell; and
current mirror type sense means in response to said sense current, for generating potential signal through current mirror operation on said sense current on said data line,
said current mirror type sense means including
a PN diode coupled between a first source potential and said data line,
a PNP bipolar transistor connected with said PN diode in a current mirror arrangement, and
a current mirror circuit having an N-channel insulated gate type field effect transistor as a component, for receiving a current supplied by said PNP bipolar transistor and converting said received current to a voltage signal by a current mirror operation.

7. A sense amplifier circuit in a semiconductor memory device having a plurality of memory cells each storing information, for detecting and amplifying data of a memory cell selected from said plurality of memory cells, said sense amplifier circuit comprising:
a data line;
first sense means for generating a sense current on said data line in response to said data of said selected memory cell; and
current mirror type sense means in response to said sense current, for generating and outputting a potential signal through current mirror operation on said sense current on said data line,
said current mirror type sense means including
(a) clamp means for clamping a potential of said data line at a prescribed potential level, said clamp means including a PN diode coupled between a first source potential and said data line,
(b) a PNP bipolar transistor connected with said PN diode in a current mirror arrangement, and
(c) resistance means connected between said PNP bipolar transistor and a second source potential for converting a current supplied by said PNP bipolar transistor to said potential signal.

8. A sense amplifier circuit in accordance with claim 7, further comprising voltage amplification means for amplifying said voltage signal generated by said resistance means.

9. A sense amplifier circuit in a semiconductor memory device having a plurality of memory cells each storing information, for detecting and amplifying data of a memory cell selected from said plurality of memory cells, said sense amplifier circuit comprising:
a data line;
first sense means for generating a sense current on said data line in response to said data of said selected memory cell;
current mirror type sense means in response to said sense current, for generating and outputting a potential signal through current mirror operation on said sense current on said data line,
said current mirror type sense means including
(a) clamp means for clamping a potential of said data line at a prescribed potential level, said clamp means including a PN diode coupled between a first source potential and said data line,
(b) a PNP bipolar transistor connected with said PN diode in a current mirror arrangement, and
(c) resistance means connected between said PNP bipolar transistor and a second source potential for converting a current supplied by said PNP bipolar transistor to said potential signal; and
voltage amplification means for amplifying said voltage signal generated by said resistance means,
said voltage amplification means including
a current mirror type load circuit formed by an insulated gate type transistor, and
a drive circuit having an insulated gate type transistor as a component for differentially amplifying said voltage signal.

10. A sense amplifier circuit in a semiconductor memory device having a plurality of memory cells each storing information, for detecting and amplifying data of a memory cell selected from said plurality of memory cells, said sense amplifier circuit comprising:
a data line;
first sense means for generating a sense current on said data line in response to said data of said selected memory cell; and current mirror type sense means in response to said sense current, for generating and outputting a potential signal through current mirror operation on said sense current on said data line, said current mirror type sense means including
  (a) clamp means for clamping a potential of said data line at a prescribed potential level, said clamp means including a PN diode coupled between a first source potential and said data line,
  (b) a PNP bipolar transistor connected with said PN diode in a current mirror arrangement,
  (c) resistance means connected between said PNP bipolar transistor and a second source potential for converting a current supplied by said PNP bipolar transistor to said potential signal, and
  (d) voltage swing reducing means for reducing the swing of said voltage signal generated by said resistance means.

11. A sense amplifier circuit in accordance with claim 10, wherein said voltage swing reducing means comprises a diode connected between said resistance means and a node supplying said second source potential in the forward direction as viewed from said resistance means.

12. A sense amplifier circuit in a semiconductor memory device having a plurality of memory cells each storing information, for detecting and amplifying data of a memory cell selected from said plurality of memory cells, said sense amplifier circuit comprising:

a data line;
first sense means for generating a sense current on said data line in response to said data of said selected memory cell;
current mirror type sense means in response to said sense current for generating a potential signal through current mirror operation on said sense current on said data line, said current mirror type sense means including
  clamp means for clamping a potential of said data line at a prescribed potential level, said clamp means including
    a PN diode coupled between a first source potential and said data line,
    a PNP bipolar transistor connected with said PN diode in a current mirror arrangement, and
    a current mirror circuit having an N-channel insulated gate type field effect transistor as a component, for receiving a current supplied by said PNP bipolar transistor and converting said received current to a voltage signal by a current mirror operation; and
saturation preventing means for preventing said PNP bipolar transistor from being saturated.

13. A sense amplifier circuit in accordance with claim 12, wherein said saturation preventing means comprises a second clamp means provided between a collector of said PNP bipolar transistor serving as a voltage signal output node and a second source potential node, for clamping the potential of said voltage signal output node at a prescribed potential level.

14. A sense amplifier circuit in accordance with claim 13, wherein said second clamp means comprises a plurality of diodes connected in series between said voltage signal output node and said second source potential node.

15. A sense amplifier circuit in a semiconductor memory device having a plurality of memory cells each storing information, for detecting and amplifying data of a memory cell selected from said plurality of memory cells, said sense amplifier circuit comprising:

a data line including a pair of complementary signal lines;
first sense means for generating a sense current on said data line in response to said data of the selected memory cell; and
current mirror type sense means in response to said sense current, for effecting a current mirror operation on said sense current to produce a mirror current and for generating a potential signal according to said mirror current, said current mirror type sense means including clamp means for clamping a potential of said data line at a prescribed potential level, said clamp means including diode elements provided for respective signal lines of said pair of complementary signal lines.

16. A sense amplifier circuit in a semiconductor memory device having a plurality of memory cells each storing information, for detecting and amplifying data of a memory cell selected from said plurality of memory cells, said sense amplifier circuit comprising:

a data line including a single signal line;
first sense means for generating a sense current on said data line in response to said data of the selected memory cell; and
current mirror type sense means in response to said sense current, for effecting a current mirror operation on said sense current to produce a mirror current and for generating a potential signal according to said mirror current, said current mirror type sense means including clamp means for clamping a potential of said data line at a prescribed potential level,
said claim means of said current mirror type sense means including
  a clamp diode for clamping the potential of said single signal line,
  a bipolar transistor connected with said clamp diode in a current mirror fashion for supplying a current from a first power source, and
  an insulated gate type transistor having a gate and one conduction terminal interconnected and provided between said bipolar transistor and a second power source.

17. A sense amplifier circuit in accordance with claim 16, Wherein said insulated gate type transistor serves as a resistive element.

18. A sense amplifier circuit in accordance with claim 16, wherein said insulated gate type transistor serves as a diode element.

19. A sense amplifier circuit in a semiconductor memory device having a plurality of memory cells each storing information, for detecting and amplifying data of a memory cell selected from said plurality of memory cells, said sense amplifier circuit comprising:

a data line;
first sense means for generating a sense current on said data line in response to said data of the selected memory cell; and
current mirror type sense means in response to said sense current, for effecting a current mirror operation on said sense current to produce a mirror current and for generating a potential signal according to said mirror current, said current mirror type sense means including clamp means for clamping a potential of said data line at a prescribed potential level, said clamp means having a diode element and a constant current source for supplying a constant current to said diode element, the value of said current supplied by said constant current source being made sufficiently smaller than said sense current.

20. A method of detecting and amplifying data of a selected memory cell in a semiconductor memory device having a plurality of memory cells each storing information, said method including the steps of:

generating a sense current on a data line being clamped by a clamp diode in response to said selected memory cell data, said sense current being supplied to said data line through said clamp diode;

generating a current mirror current of a current flowing through said clamp diode; and converting said current mirror current to a voltage signal.

* * * * *